(12) United States Patent
Chen et al.

(10) Patent No.: US 7,465,530 B1
(45) Date of Patent: Dec. 16, 2008

(54) INORGANIC RESIST MATERIAL AND NANO-FABRICATION METHOD BY UTILIZING THE SAME

(75) Inventors: Jung-Po Chen, Mingjian Township, Nantou County (TW); Ming-Fang Hsu, Banciao (TW); An-Tse Lee, Tucheng (TW); Chung-Ta Cheng, Yonghe (TW); Chin-Tien Yang, Yonghe (TW); Sheng-Li Chang, Jhubei (JP); Kuo-Chi Chiu, Jhubei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/006,708

(22) Filed: Jan. 4, 2008

(30) Foreign Application Priority Data

Aug. 16, 2007 (TW) .............................. 96130337 A

(51) Int. Cl.
*G03F 7/00* (2006.01)
*G03F 7/004* (2006.01)

(52) U.S. Cl. .................... 430/270.1; 430/311; 430/313; 430/317; 430/320; 430/321

(58) Field of Classification Search .............. 430/270.1, 430/311, 313, 317, 320, 321
See application file for complete search history.

(56) References Cited

U.S. PATENT DOCUMENTS

| | | | | |
|---|---|---|---|---|
| 6,141,315 | A * | 10/2000 | Ebina et al. | 369/275.2 |
| 6,445,675 | B1 * | 9/2002 | Ebina et al. | 369/275.2 |
| 7,037,413 | B1 * | 5/2006 | Otoba et al. | 204/192.16 |
| 7,175,962 | B2 | 2/2007 | Kouchiyama et al. | 430/207.1 |
| 2005/0082162 | A1 * | 4/2005 | Uno et al. | 204/192.26 |
| 2007/0036933 | A1 * | 2/2007 | Endoh et al. | 428/64.1 |
| 2008/0037406 | A1 * | 2/2008 | Yuzurihara et al. | 369/284 |

* cited by examiner

*Primary Examiner*—Amanda C. Walke
(74) *Attorney, Agent, or Firm*—J.C. Patents

(57) ABSTRACT

An inorganic resist material is provided, which is an incomplete oxide of a phase-change material. The oxygen content in the inorganic resist material is lower than the stoichiometric oxygen content of a complete oxide of the phase-change material, and a general formula of the inorganic resist material is $A_{1-x}O_x$, in which A represents the phase-change material, and x is between 5 at. % and 65 at. %. The inorganic resist material can be used to form line patterns or recording pits with size smaller than the exposure light spot by using the laser of conventional lithography process as an exposure source.

30 Claims, 13 Drawing Sheets

INORGANIC RESIST MATERIAL AND NANO-FABRICATION METHOD BY UTILIZING THE SAME

CROSS-REFERENCE TO RELATED APPLICATION

This application claims the priority benefit of Taiwan application serial no. 96130337, filed Aug. 16, 2007. The entirety of the above-mentioned patent application is incorporated herein by reference and made a part of this specification.

BACKGROUND OF THE INVENTION

1. Field of the Invention

The present invention relates to a nano-fabrication method, and more particularly, to an inorganic resist material and a nano-fabrication method by utilizing the same.

2. Description of Related Art

With the rapid development of 3C science and technology, it is necessary for the semiconductor process and information recording media process to reduce line width or the size of recording pit, so as to improve the operation speed and the recording density. Taking optical disc storage as an example, the length of the minimum recording pit of DVD discs is approximately 400 nm, and the length of the minimum recording pit of the next generation optical disc is approximately 170 nm. The line width of semiconductor process is reduced from several hundreds of nanometers to several tens of nanometers. Therefore, in order to fabricate extremely fine line width or recording pit, people have made continuous efforts to improve the method of lithography processing.

In a conventional lithography processing, organic material coated on a substrate is generally used as a photoresist layer, and the organic photoresist is exposed to blue light or ultraviolet light; next, the exposed region or the unexposed region is dissolved by using a characteristic that a developer has good dissolution selectivity to the exposed and unexposed organic photoresist, so as to fabricate fine pattern structure on the surface of the organic photoresist layer.

In the conventional process, a photo-sensitive organic material is used as the resist material, and mechanism utilizes the property of the material that photons with suitable wavelength will change chemical structure thereof, and such a change in the chemical structure makes the developer have obviously different solubility to the organic photoresist. However, even a small amount of photons can also cause a change in the chemical structure of the organic photoresist to some extent. Therefore, such method merely can fabricate line patterns or recording pits with similar size to the exposure light spot. Furthermore, the organic resist material is a polymer material, so after exposure and development, the edges of the patterns or the recording pits are likely to be rough, and fine line patterns or recording pits in the level of several nanometers are difficult to be fabricated.

Recently, in order to solve the problem that the conventional lithography process cannot achieve the fine line patterns or recording pits with the accuracy of several nanometers, a method of reducing the wavelength of the exposure light source has been set forth. However, the fabrication cost is increased significantly due to the problems such as short-wavelength laser is used and the optical elements of the exposure mechanism must be made of specific materials, and the problem that the edges of patterns or the recording pits become rough after exposure and development cannot be solved. Therefore, many more advanced techniques are applied in the lithography process, such as, ion-beam, electron-beam lithography technique. Though such techniques can meet the requirements of reaching the accuracy of several nanometers, the problems of slow process and high cost still exist.

SUMMARY OF THE INVENTION

Accordingly, the present invention is related to provide an inorganic resist material, which is an incomplete oxide of a phase-change material. The general formula of the inorganic resist material is $A_{1-x}O_x$, in which A represents phase-change material, and x is between 5 at. % and 65 at. %.

The present invention is further related to provide a nano-fabrication method, which includes: coating an inorganic resist film on a substrate, in which the material of the inorganic resist film is the incomplete oxide of a phase-change material; next, irradiating the inorganic resist film with focused laser by using a laser exposure device, such that the inorganic resist film of the exposed region performs a phase transition; and removing the inorganic resist film of the exposed region, so as to form a nano-pattern on the inorganic resist film.

The inorganic resist material of the present invention is a heat-sensitive material, so merely the region having a temperature higher than the phase transition temperature will perform a phase transition during exposure, and the resultant nano-pattern has a size smaller than the exposure light spot.

In order to make the present invention comprehensible, embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
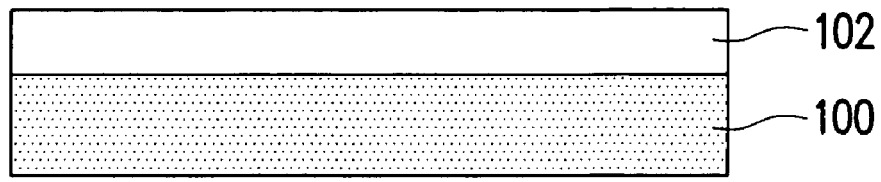
FIGS. 1A to 1C are cross-sectional views of a manufacturing process of a nano-fabrication according to a first embodiment of the present invention.

To fully understand the present invention, please make reference to the following drawings. However, the present invention can be implemented by a variety of methods and would not be construed to be limited to the embodiments described herein. In practice, these embodiments are provided merely to make the content of the present invention more detailed and comprehensive, and at the same time, to completely deliver the scope of the present invention to those of ordinary skills in the art. Furthermore, for the sake of clarity, the sizes of the layers and resigns and the corresponding sizes may be magnified in the drawings.

Figure 1B:
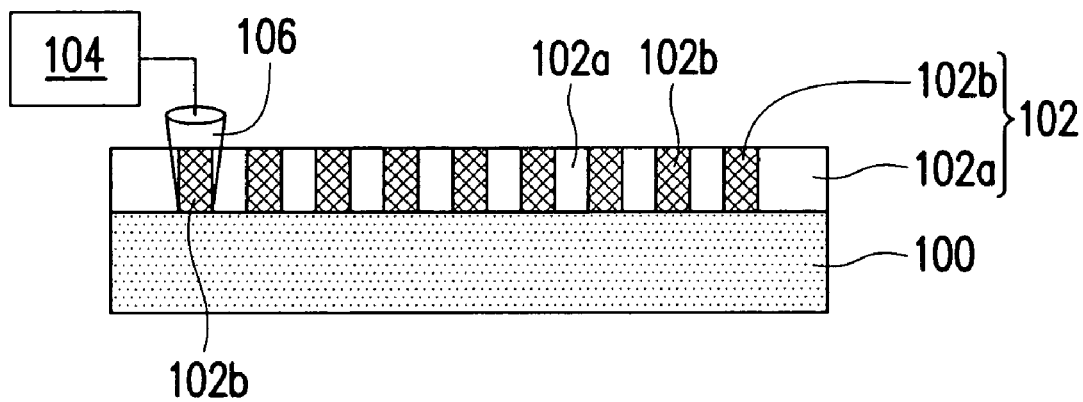
Figure 1C:
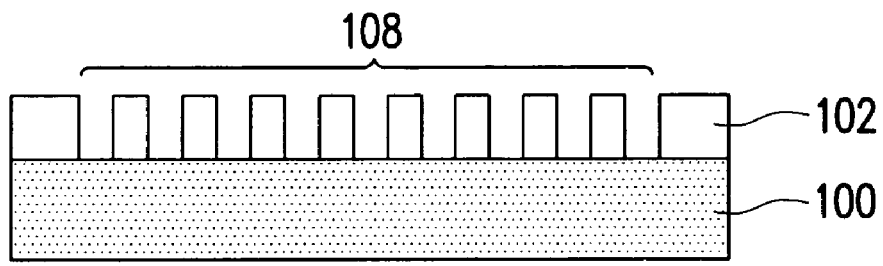

FIGS. 1A to 1C are cross-sectional views of a manufacturing process of a nano-fabrication according to a first embodiment of the present invention.

Referring to FIG. 1A, a layer of inorganic resist film 102 is coated on a substrate 100. The material of the inorganic resist film 102 of the first embodiment is an incomplete oxide of a phase-change material. The so-called "incomplete oxide" means that the oxygen content of the inorganic resist material is lower than the stoichiometric oxygen content of the complete oxide of the phase-change material, and it can be known from the general formula $A_{1-x}O_x$ of the inorganic resist material that A represents phase-change material, and x is between 5 at. % and 65 at. %. The phase-change material is, for example, an alloy consisting of elements Se, Te, Sb, As, Sn, Ge, or In; such as, Ge—Sb—Te, Ge—Sb—Sn, or In—Ge—Sb—Te alloy. Taking Ge—Sb—Sn alloy as an example, when the phase-change material is expressed as a general formula of $Ge_aSb_bSn_{1-a-b}$, a is approximately 5-15 at. %, b is approximately 10-50 at. %. The method of coating the inorganic resist film 102 is, for example, oxygen reactive sputtering. Further, the substrate 100 can include a silicon substrate, a glass substrate, a single crystal alumina ($Al_2O_3$) substrate, a plastic substrate, or a metal substrate.

Next, referring to FIG. 1B, the inorganic resist film 102 is irradiated with a focused laser 106 by using a set of laser exposure device 104, such that the inorganic resist film of the exposed region transits from an initial state 102a to a phase transition state 102b. The laser exposure device 104 can be an exposure device for the lithography process, so no additional equipment cost is required. As such an inorganic resist film 102 has preferred absorption in the visible band and the UV-band, lasers of various wavelengths can be used as the exposure source, for example, blue band. The inorganic resist film will have a phase change by adjusting the power of the laser during exposure and the exposure time, and the width of the nano-pattern formed subsequently can be adjusted by adjusting the power of the laser 106 irradiating the inorganic resist film 102 and the exposure time. Furthermore, the oxygen content of the oxide layer of the phase-change material can also be adjusted by adjusting the flow ratios of Ar and $O_2$ during sputtering.

Next, referring to FIG. 1C, the inorganic resist film transited to the phase transition state (see 102b in FIG. 1B) is removed, so as to from a nano-pattern 108 on the inorganic resist film 102, in which the nano-pattern 108 can be a line pattern or a recording pit. The removing method is, for example, dissolving the inorganic resist film of the phase transition state 102b with an alkali solution, in which the alkali solution is, for example, a KOH or NaOH solution.

Figure 1D:
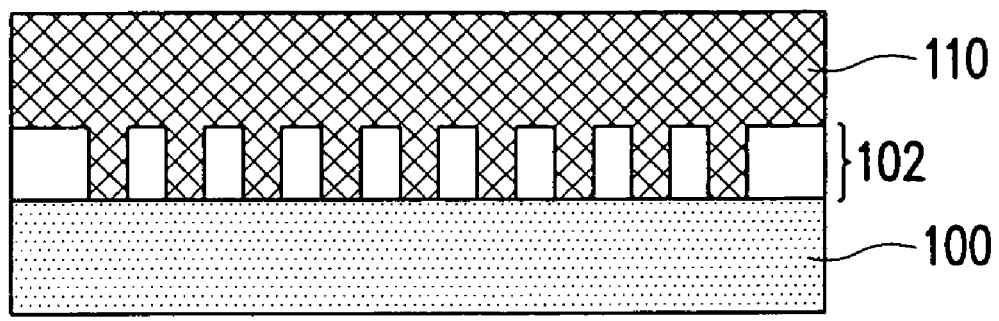
FIGS. 1D to 1E are cross-sectional views of the fabricating process of the nano-fabrication of the first embodiment applied to an optical disc master plate.
Figure 1E:
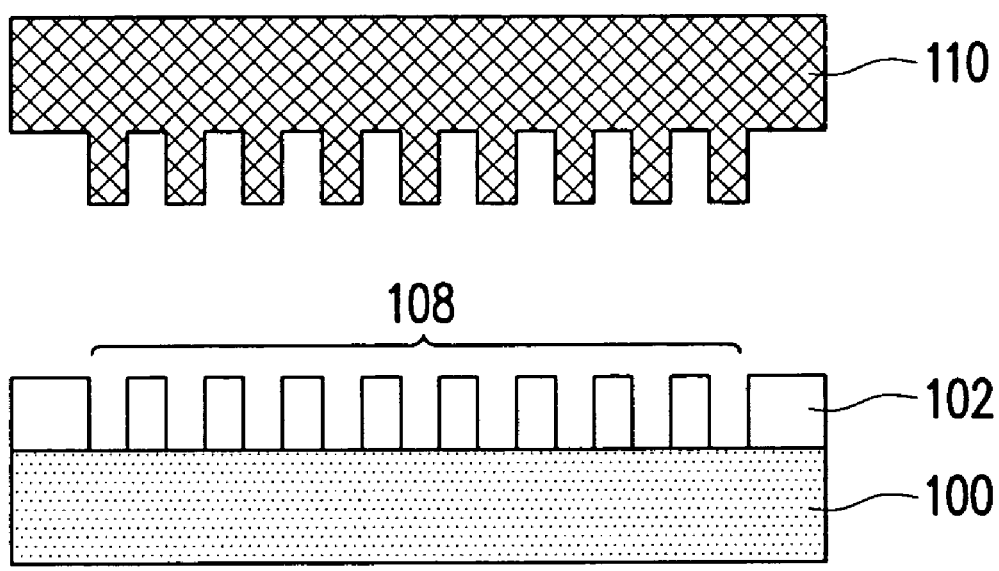

The nano-fabrication method of the first embodiment can use a laser of a conventional lithography process as the exposure source, and the process is rapid and low-cost, so it can be widely applied in the processes of semiconductors, recording media, magnetic elements, and displays. FIGS. 1D to 1E are cross-sectional views of the fabricating process of the nano-fabrication of the first embodiment applied to an optical disc master plate.

Referring to FIG. 1D, after the steps in FIGS. 1A to 1C, a metal layer 110 can be plated on a surface of the inorganic resist film 102, in which the material of the metal layer 110 is, for example, selected from the metals including Ni, Ag, Pt, Pd, or an alloy thereof. The method of plating the metal layer 110 includes vacuum sputtering or electroplating.

Then, referring to FIG. 1E, the metal layer 110 and the inorganic resist film 102 are separated, and at this time, a nano-pattern is also formed on a surface of the metal layer 110 corresponding to the nano-pattern 108, thus completing the fabrication of the optical disc master plate (i.e., 110).

FIGS. 2A to 2D are cross-sectional views of a manufacturing process of a nano-fabrication according to a second embodiment of the present invention, in which the same reference numerals indicate the same components in the first embodiment.

Figure 2A:
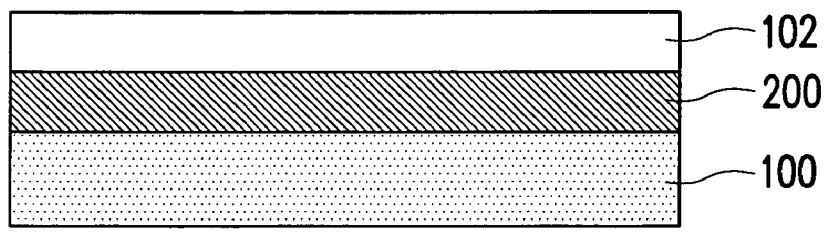
FIGS. 2A to 2D are cross-sectional views of a manufacturing process of a nano-fabrication according to a second embodiment of the present invention.

Referring to FIG. 2A, firstly, an intermediate layer 200 is formed on a substrate 100, and a step of coating an inorganic resist film 102 is performed. The intermediate layer 200 can be a thermal barrier layer that can reduce the heat dissipation speed of the film and improve the exposure sensitivity or a dry-etchable layer, and the material of the intermediate layer 200 can be $Al_2O_3$, AlN, SiC, $SiO_y$, $SiN_z$, ZnS—$SiO_2$, or organic polymer materials.

Figure 2B:
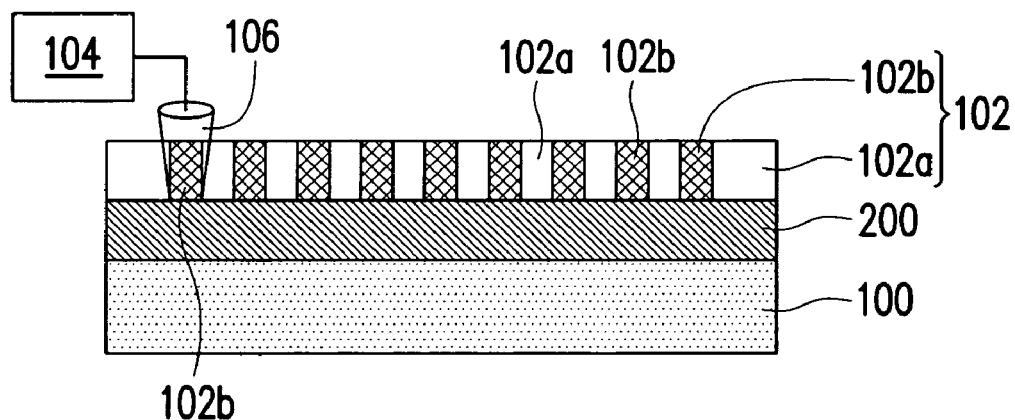
Figure 2C:
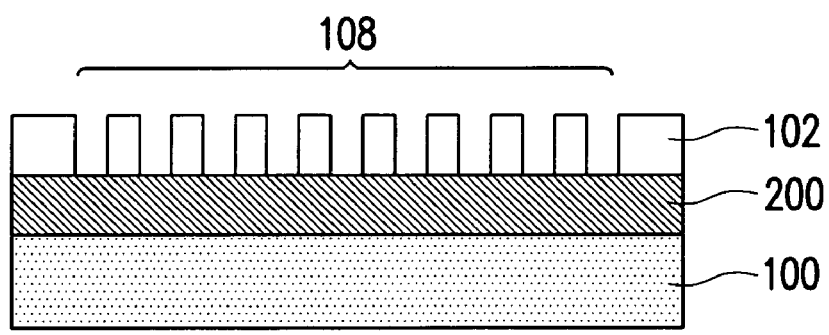

Then, referring to FIGS. 2B to 2C, the inorganic resist film 102 is irradiated with a focused laser 106 by using a laser exposure device 104, such that the inorganic resist film of the exposed region transits from an initial state 102a to a phase transition state 102b (as shown in FIG. 2B). Next, the inorganic resist film transited to the phase transition state 102b is removed, so as to from a nano-pattern 108 on the inorganic resist film 102 (as shown in FIG. 2C).

Figure 2D:
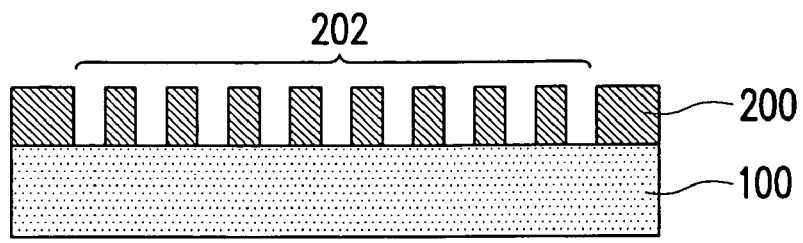

Next, referring to FIG. 2D, after completing the nano-pattern 108, the intermediate layer 200 is etched with a dry etching process by selecting the inorganic resist film 102 as a mask, in which the dry etching process includes reactive ion etching (RIE) or inductive coupling plasma (ICP) etching. Then, the inorganic resist film 102 is removed to transfer the nano-pattern 108 in FIG. 2C to the intermediate layer 200 to be the same nano-pattern 202.

Figure 2E:
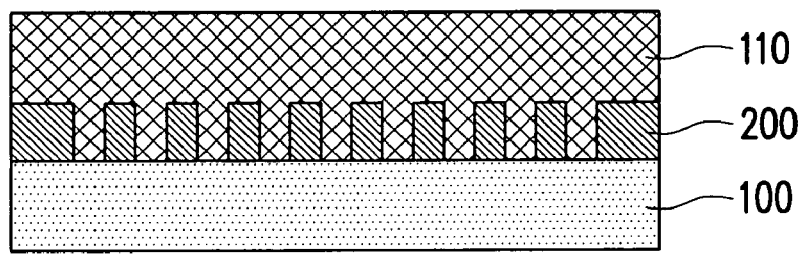
FIGS. 2E to 2F are cross-sectional views of the fabricating process of the nano-fabrication of the second embodiment applied to an optical disc master plate.
Figure 2F:
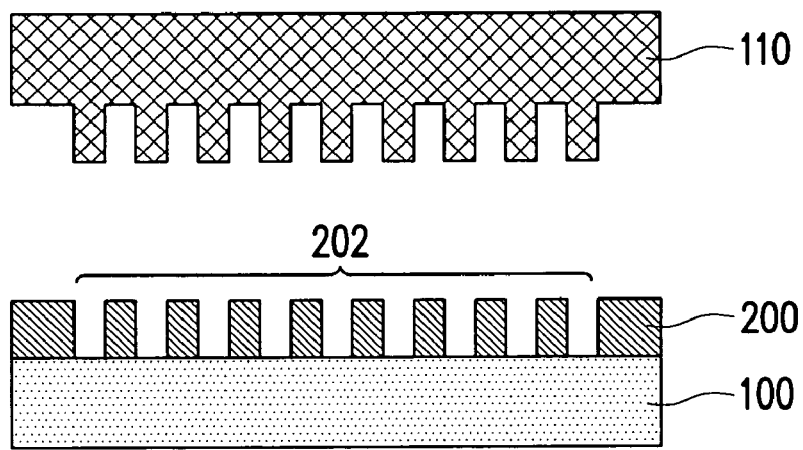

The nano-fabrication method of the second embodiment can also use a laser of a conventional lithography process as the exposure source, so it can be widely applied in the processes of semiconductors, recording media, magnetic elements, and displays. FIGS. 2E to 2F are cross-sectional views of the fabricating process of the nano-fabrication of the second embodiment applied to an optical disc master plate.

Referring to FIG. 2E, after the steps in FIGS. 2A to 2D, a metal layer 110 can be plated on a surface of the intermediate layer 200, in which the material of the metal layer 110 is as described in the first embodiment.

Then, referring to FIG. 2F, the metal layer 110 and the intermediate layer 200 are separated, and at this time, a nano-pattern is also formed on a surface of the metal layer 110 corresponding to the nano-pattern 108, thus completing the fabrication of the optical disc master plate (i.e., 110).

FIGS. 3A to 3D are cross-sectional views of a manufacturing process of a nano-fabrication according to a third embodiment of the present invention, in which the same reference numerals indicate the same components in the first embodiment.

Figure 3A:
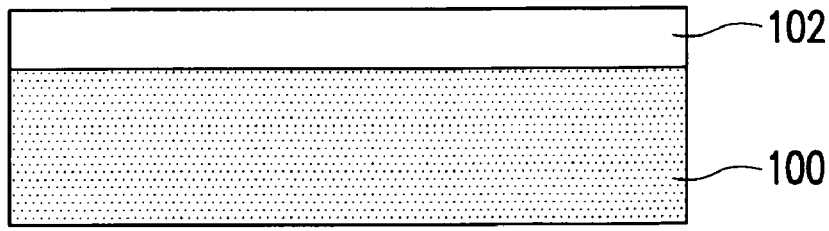
FIGS. 3A to 3D are cross-sectional views of a manufacturing process of a nano-fabrication according to a third embodiment of the present invention.

Referring to FIG. 3A, an inorganic resist film 102 is coated on a substrate 100.

Figure 3B:
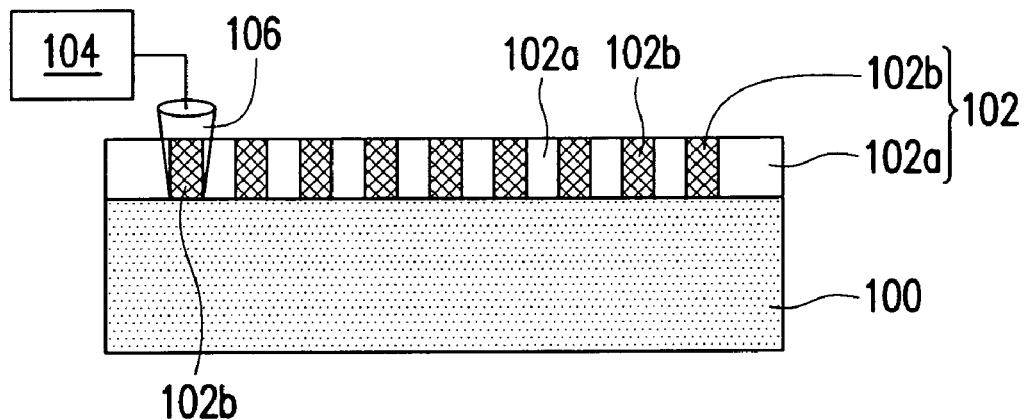
Figure 3C:
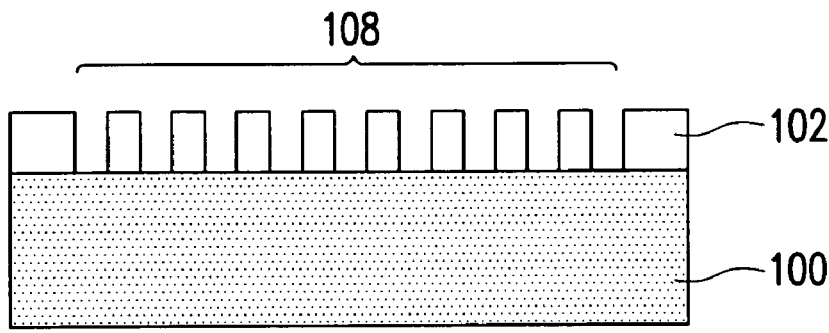

Next, referring to FIGS. 3B to 3C, the inorganic resist film 102 is irradiated with a focused laser 106 by using a laser exposure device 104, such that the inorganic resist film of the exposed region transits from an initial state 102a to a phase transition state 102b (as shown in FIG. 3B). Next, the inorganic resist film transited to the phase transition state 102b is removed, so as to from a nano-pattern 108 on the inorganic resist film 102 (as shown in FIG. 3C).

Figure 3D:
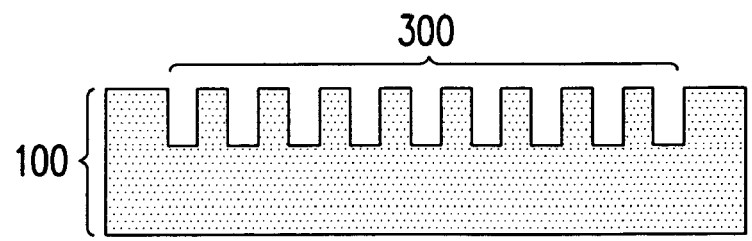

Then, referring to FIG. 3D, after completing the nano-pattern 108, the substrate 100 is etched with a dry etching process by selecting the inorganic resist film 102 (as shown in FIG. 3C) as a mask, in which the dry etching process includes RIE or ICP etching. Then, the inorganic resist film 102 is removed to transfer the nano-pattern 108 in FIG. 3C to the substrate 100 to be the same nano-pattern 300.

Figure 3E:
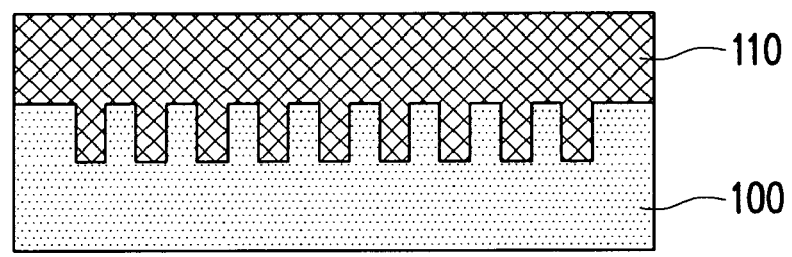
FIGS. 3E to 3F are cross-sectional views of the fabricating process of the nano-fabrication of the third embodiment applied to an optical disc master plate.
Figure 3F:
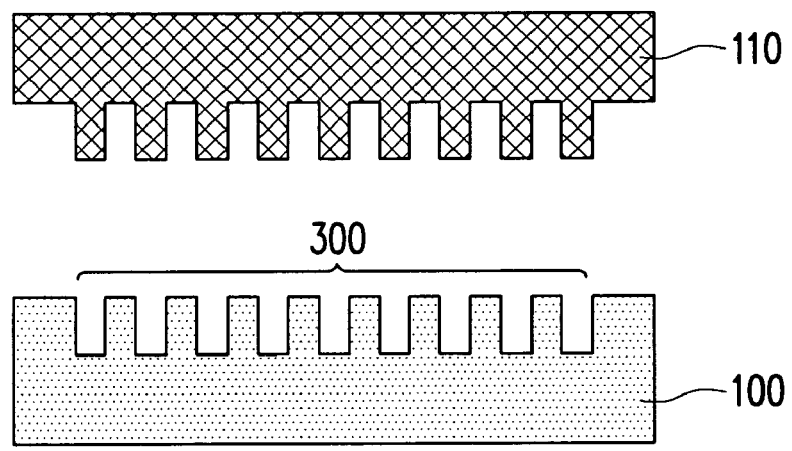

The nano-fabrication method in the third embodiment can also use a laser of a conventional lithography process as the exposure source, so it can be widely applied in the processes of semiconductors, recording media, magnetic elements, and displays. FIGS. 3E to 3F are cross-sectional views of the fabricating process of the nano-fabrication of the third embodiment applied to an optical disc master plate.

Referring to FIG. 3E, after the steps in FIGS. 3A to 3D, a metal layer 110 can be plated on a surface of substrate 100, in which the material of the metal layer 110 is as described in the first embodiment.

Then, referring to FIG. 3F, the metal layer 110 and the substrate 100 are separated, and at this time, a nano-pattern is also formed on a surface of the metal layer 110 corresponding to the nano-pattern 300, thus completing the fabrication of the optical disc master plate (i.e., 110).

Hereinafter, several experimental examples are described to verify the efficacy of the inorganic resist material of the present invention.

Experimental Example (1)

A ZnS—SiO$_2$ layer having a thickness of 70 nm is coated on a polycarbonate (PC) substrate of a rewritable digital versatile disc (DVD-RW) by vacuum sputtering as an intermediate layer. Next, an incomplete oxide with Ge—Sb—Sn as the phase-change material is coated on the ZnS—SiO$_2$ layer by oxygen reactive sputtering, in which the thickness of the incomplete oxide of the phase-change material (Ge—Sb—Sn) is approximately 120 nm. Meanwhile, during coating the incomplete oxide layer of the phase-change material (Ge—Sb—Sn), the oxygen content of the incomplete oxide of the phase-change material (Ge—Sb—Sn) is adjusted by adjusting the flow ratio of Ar and O$_2$. In this experimental example, a sample having a flow ratio of Ar and O$_2$ being 10:3 is prepared.

Figure 4:
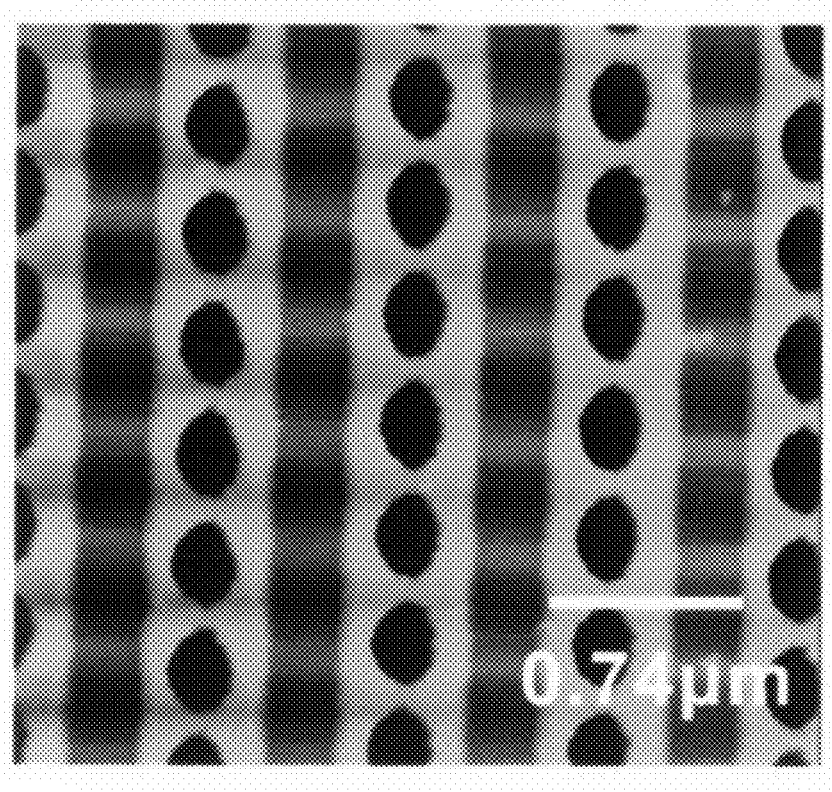
FIG. 4 is an atomic force microscopy (AFM) image of the first experimental example.

In the experimental example (1), the wavelength of the exposure device is 405 nm, numerical aperture NA is 0.65, and rotation speed of the substrate is 6.6 m/s. After the sample is exposed, the phase transition part is removed by dissolving with a KOH solution, so as to form fine recording pits on the surface of the incomplete oxide of the phase-change material (Ge—Sb—Sn). An atomic force microscopy (AFM) image of the sample in this experimental example is as shown in FIG. 4, and the experimental results show that the sample with a flow ratio of Ar and O$_2$ being 10:3 has significant etching selectivity after exposure, and the surface and edges of the recording pits are less rough, as shown in FIG. 4. After the sample is exposed and etched, the depth of the recording pits is about 120 nm, which means the unexposed oxide layer of the phase-change material (Ge—Sb—Sn) is almost not dissolved in the KOH solution during removal, so the dissolution selectivity is high.

Experimental Example (2)

The same ZnS—SiO$_2$ layer and the incomplete oxide of the phase-change material are formed on a PC substrate of a DVD-RW in the same manner as that of the first embodiment, in which the laser is output in a manner of single pulse output. The difference between the experimental example (2) and the experimental example (1) is that samples under exposure laser powers of 7 mW, 7.5 mW, and 8 mW are respectively prepared. When the alkali solution for removing the phase transition part is a KOH solution, the removal time is merely 40 sec, and the results of this experimental example are shown in the accompanying drawings.

Figure 5A:
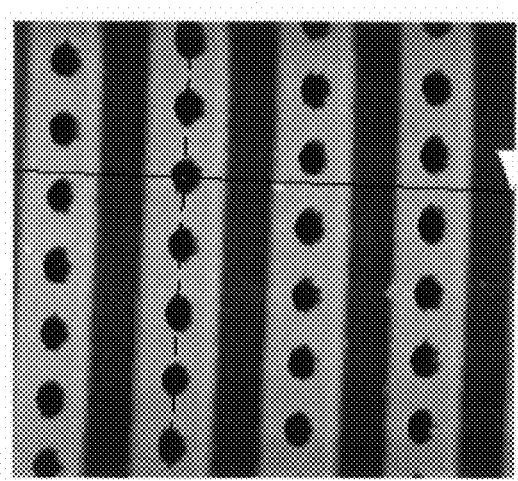
FIG. 5A is an AFM image of a sample at an exposure laser power of 7 mW.
Figure 5B:
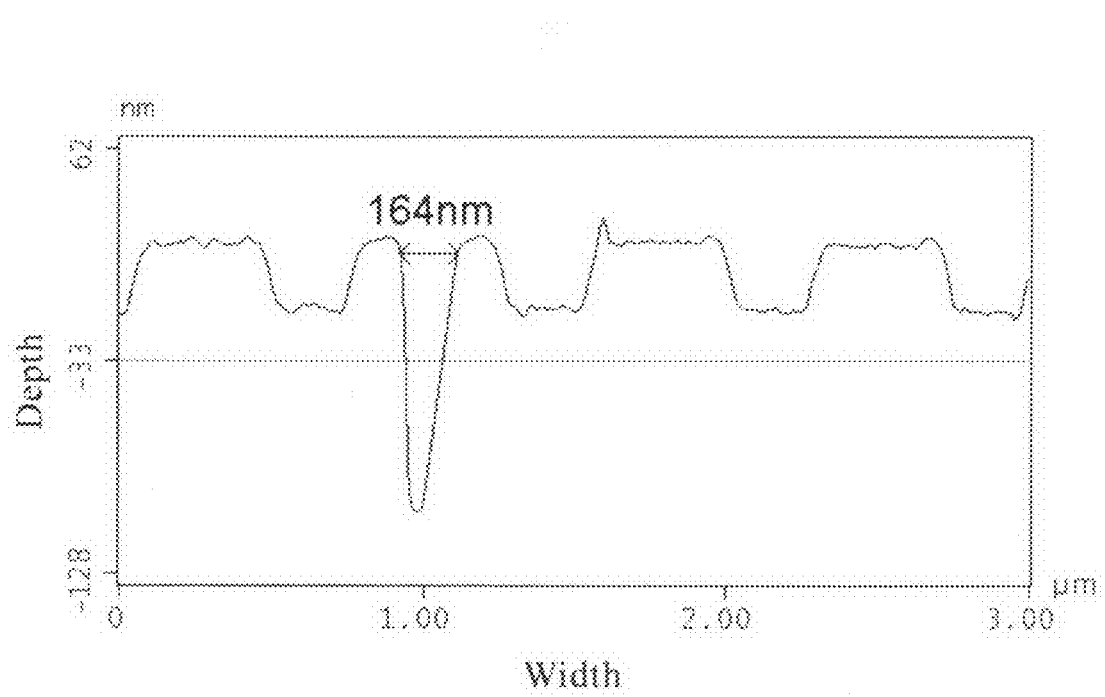
FIG. 5B is a surface curve of the sample in FIG. 5A.
Figure 6A:
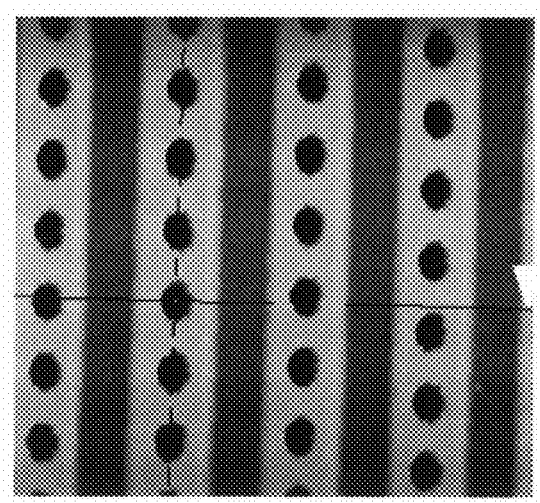
FIG. 6A is an AFM image of a sample at an exposure laser power of 7.5 mW.
Figure 6B:
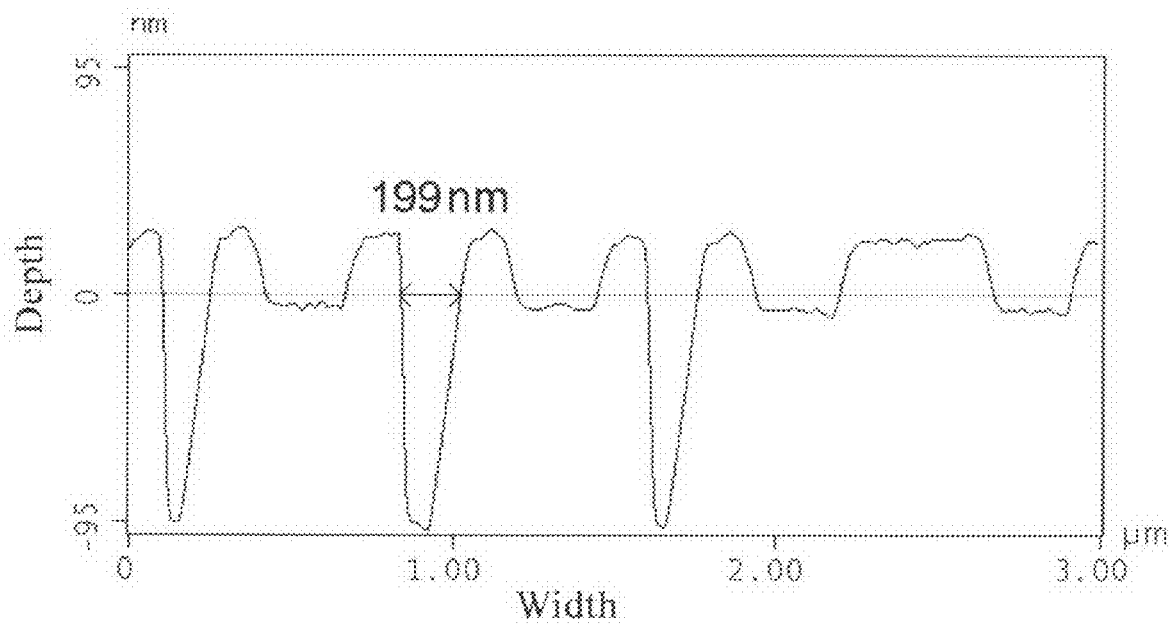
FIG. 6B is a surface curve of the sample in FIG. 6A.
Figure 7A:
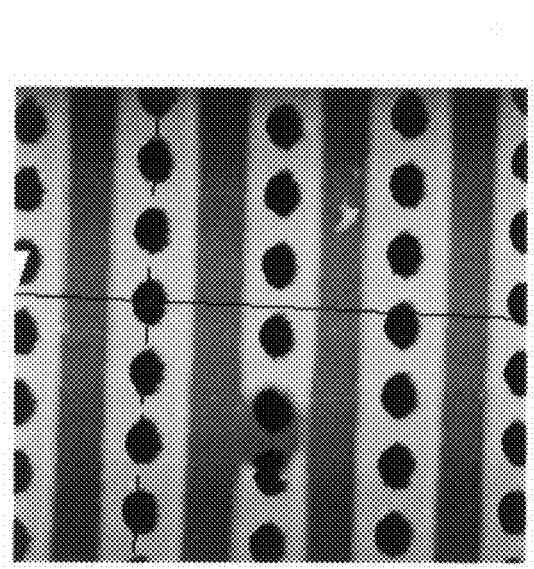
FIG. 7A is an AFM image of a sample at an exposure laser power of 8 mW.
Figure 7B:
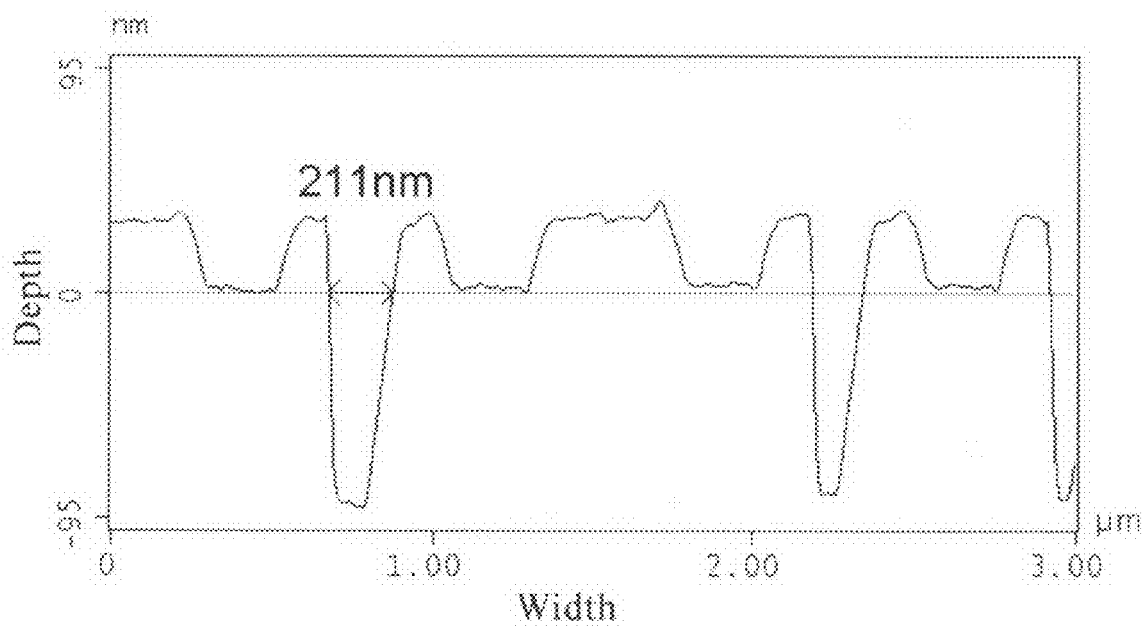
FIG. 7B is a surface curve of the sample in FIG. 7A.

FIG. 5A is an AFM image of a sample under an exposure laser power of 7 mW, and FIG. 5B is a surface curve of the sample in FIG. 5A, in which the recording pits have a width of 164 nm, and a depth of 124 nm. FIG. 6A is an AFM image of a sample under an exposure laser power of 7.5 mW, and FIG. 6B is a surface curve of the sample in FIG. 6A, in which the recording pits have a width of 199 nm, and a depth of 123 nm. FIG. 7A is an AFM image of a sample under an exposure laser power of 8 mW, and FIG. 7B is a surface curve of the sample in FIG. 7A, in which the recording pits have a width of 211 nm, and a depth of 118 nm. The results of this experimental example show that the width of the recording pits can be adjusted by adjusting the exposure laser power, when the exposure laser power is 7 mW, the width of the recording pit is 164 nm, which is much smaller than the size of the exposure light spot.

Experimental Example (3)

A ZnS—SiO$_2$ layer having a thickness of 70 nm is coated on a PC substrate of a DVD-RW by vacuum sputtering, and an incomplete oxide of a phase-change material (Ge—Sb—Sn) is coated on the ZnS—SiO$_2$ layer by oxygen reactive sputtering, in which the thickness of the incomplete oxide of the phase-change material (Ge—Sb—Sn) is approximately 65 nm. The flow ratio of Ar and O$_2$ is 10:3 during coating the incomplete oxide of the phase-change material (Ge—Sb—Sn). In this experimental example, the wavelength of the exposure device is 405 nm, the numerical aperture is NA=0.65, rotation speed of the substrate is 6.6 m/s, the laser is output in the manner of DC output, and samples under exposure laser powers of 2.5 mW, 2.75 mW, and 3 mW are respectively prepared according to different exposure laser powers. The alkali solution for removing the phase transition part is a KOH solution, and the removal time is 60 seconds.

Figure 8A:
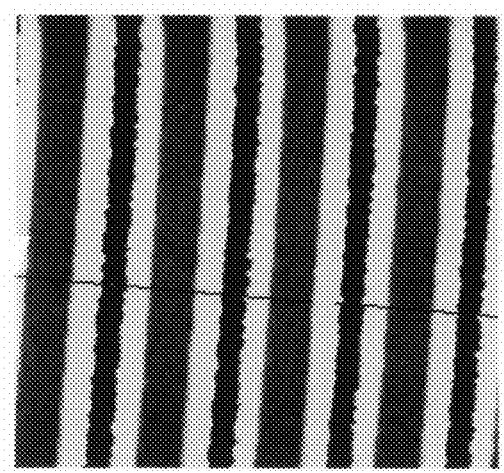
FIG. 8A is an AFM image of a sample at an exposure laser power of 2.5 mW.
Figure 8B:
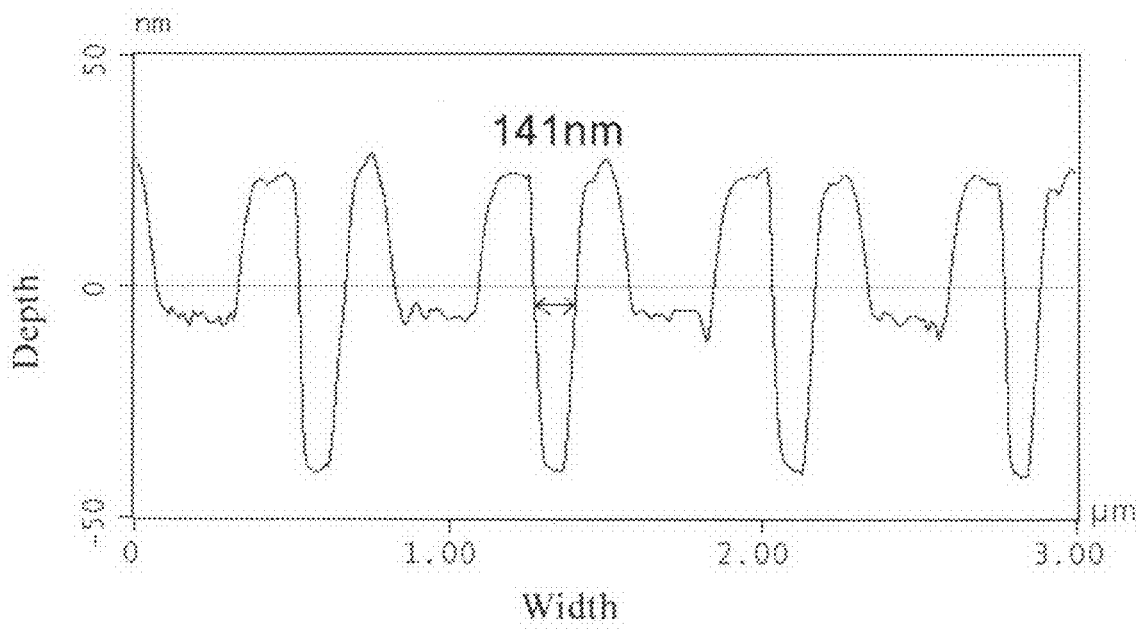
FIG. 8B is a surface curve of the sample in FIG. 8A.
Figure 9A:
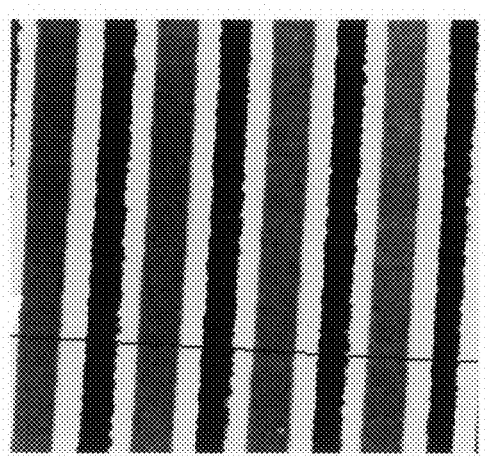
FIG. 9A is an AFM image of a sample at an exposure laser power of 2.75 mW.
Figure 9B:
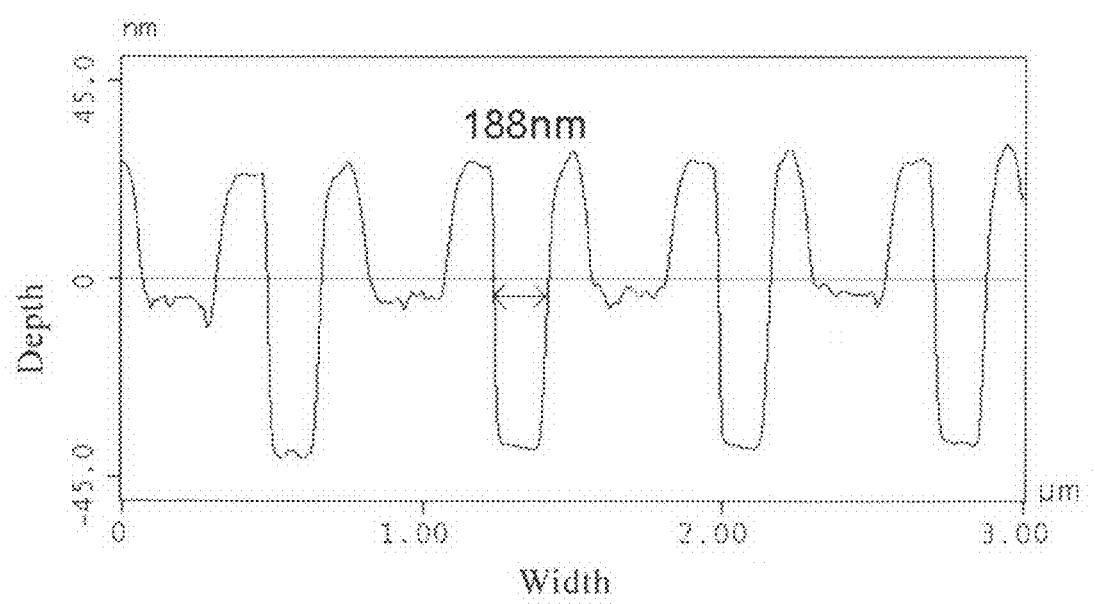
FIG. 9B is a surface curve of the sample in FIG. 9A.
Figure 10A:
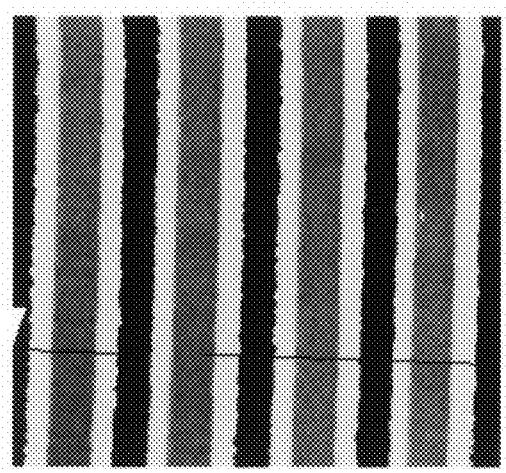
FIG. 10A is an AFM image of a sample at an exposure laser power of 3 mW.
Figure 10B:
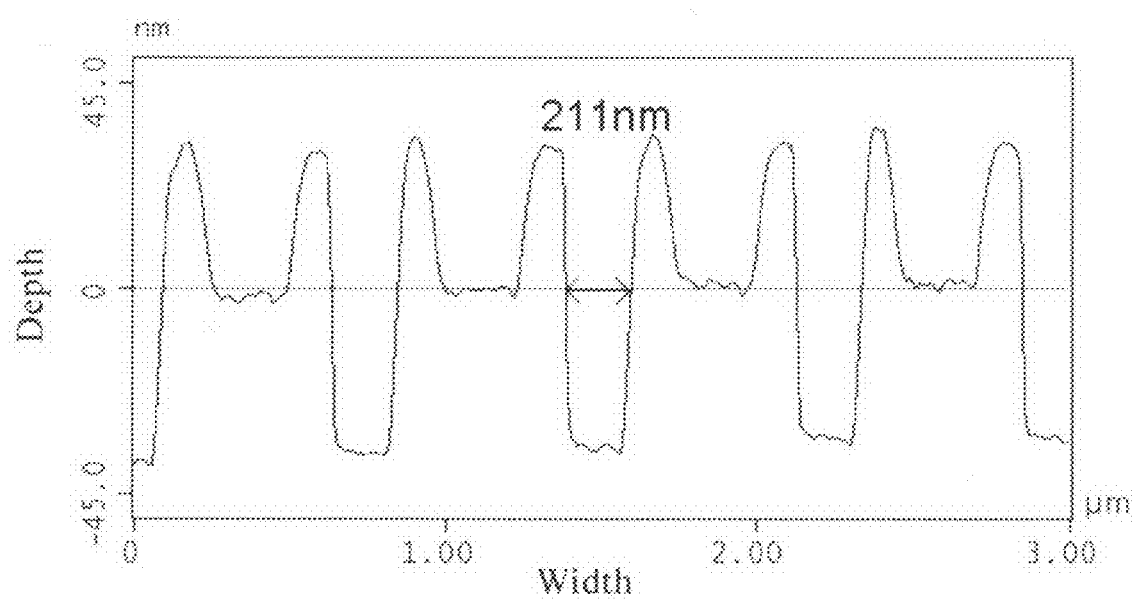
FIG. 10B is a surface curve of the sample in FIG. 10A.

The results of the experimental example (3) are as shown in the accompanying drawings. FIG. 8A is an AFM image of a sample under an exposure laser power of 2.5 mW, and FIG. 8B is a surface curve of the sample in FIG. 8A, in which the grooves have a half-width of 141 nm, and a depth of 65 nm. FIG. 9A is an AFM image of a sample under an exposure laser power of 2.75 mW, and FIG. 9B is a surface curve of the sample in FIG. 9A, in which the grooves have a half-width of 188 nm, and a depth of 65 nm. FIG. 10A an AFM image of a sample under an exposure laser power of 3 mW, and FIG. 10B is a surface curve of the sample in FIG. 10A, in which the grooves have a half-width of 211 nm, and a depth of 68 nm. This experimental example validates that the inorganic resist material of the present invention and the nano-fabrication method by utilizing the same can be used to fabricate fine line patterns.

Furthermore, the material and the method of the present invention can also be applied to the field of fabrication technology of the next generation nano-pattern structures, such as, nano-photoelectric structures, nano-electronic structures, nano-energy, and high density storage, for example, the fabrication of photon crystal; or be applied to the process of the anti-reflective layer or electrode layer in solar batteries.

In view of the above, the inorganic resist material of the present invention is an incomplete oxide of a phase-change material, when the inorganic resist material is exposed by using a laser exposure device, the inorganic resist material of the exposed region will perform a phase transition, so fine line patterns or recording pits with high accuracy can be fabricated. As the inorganic resist material is a heat-sensitive material, instead of a photo-sensitive material, merely the region having a temperature higher than the phase transition temperature will perform a phase transition during exposure, the material is applied in the nano-fabrication method to fabricate line patterns or recording pits smaller than the exposure light spot. Furthermore, the oxide crystal of the phase-change material is small, so the roughness of the edges of the patterns or the recording pits after exposure and etching is low. In addition, as a laser of conventional lithography process can be used as the exposure source, the process of the present invention is rapid and low-cost, and can be widely applied in the processes of semiconductors, recording media, magnetic elements, and displays.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An inorganic resist material is characterized in that the inorganic resist material is an incomplete oxide of a phase-change material, and the general formula of the inorganic resist material is $A_{1-x}O_x$, wherein A represents the phase-change material, and x is between 5 at. % and 65 at. %.

2. The inorganic resist material as claimed in claim 1, wherein the phase-change material is an alloy consisting of elements selected from Se, Te, Sb, As, Sn, Ge, or In.

3. The inorganic resist material as claimed in claim 2, wherein the phase-change material comprises Ge—Sb—Te, Ge—Sb—Sn, or In—Ge—Sb—Te alloy.

4. The inorganic resist material as claimed in claim 3, wherein the phase-change material is Ge—Sb—Sn alloy.

5. A nano-fabrication method, comprising:
coating an inorganic resist film on a substrate, wherein the material of the inorganic resist film is an incomplete oxide of a phase-change material, and the general formula of the incomplete oxide is $A_{1-x}O_x$, wherein A represents the phase-change material, and x is between 5 at. % and 65 at. %;
irradiating the inorganic resist film with focused laser by using a laser exposure device, such that the inorganic resist film of the exposed region perform a phase transition; and
removing the inorganic resist film of the exposed region to form a nano-pattern on the inorganic resist film.

6. The nano-fabrication method as claimed in claim 5, wherein the width of the nano-pattern is adjusted by adjusting the power of the laser irradiating the inorganic resist film and the exposure time.

7. The nano-fabrication method as claimed in claim 5, wherein the wavelength of the laser exposure device comprises visible band or UV-band.

8. The nano-fabrication method as claimed in claim 7, wherein the wavelength of the laser exposure device comprises blue band.

9. The nano-fabrication method as claimed in claim 5, wherein the method of removing the inorganic resist film of exposed region comprises dissolving the inorganic resist film in crystalline state by using an alkali solution.

10. The nano-fabrication method as claimed in claim 9, wherein the alkali solution comprises a KOH or NaOH solution.

11. The nano-fabrication method as claimed in claim 5, wherein the substrate comprises a silicon substrate, a glass substrate, a single crystal alumina ($Al_2O_3$) substrate, a plastic substrate, or a metal substrate.

12. The nano-fabrication method as claimed in claim 5, wherein after forming the nano-pattern, the method further comprises:
plating a metal layer on a surface of the inorganic resist film; and
separating the metal layer and the inorganic resist film, so as to get an optical disc master plate.

13. The nano-fabrication method as claimed in claim 12, wherein method of plating the metal layer on the surface of the inorganic resist film comprises vacuum sputtering or electroplating.

14. The nano-fabrication method as claimed in claim 12, wherein the material of the metal layer is selected from metals comprising Ni, Ag, Pt, Pd, or an alloy thereof.

15. The nano-fabrication method as claimed in claim 5, wherein before coating the inorganic resist film on the substrate, the method further comprises forming an intermediate layer on the substrate.

16. The nano-fabrication method as claimed in claim 15, wherein the intermediate layer is a thermal barrier layer.

17. The nano-fabrication method as claimed in claim 15, wherein the intermediate layer is a dry-etchable layer.

18. The nano-fabrication method as claimed in claim 15, wherein after forming the nano-pattern, the method further comprises:
etching the intermediate layer by using a dry etching process with the inorganic resist film as a mask;
removing the inorganic resist film to transfer the nano-pattern to the intermediate layer.

19. The nano-fabrication method as claimed in claim 18, wherein the dry etching process comprises reactive ion etching (RIE) or inductive coupling plasma (ICP) etching.

20. The nano-fabrication method as claimed in claim 18, wherein after transferring the nano-pattern to the intermediate layer, the method further comprises:
plating a metal layer on a surface of the intermediate layer; and separating the metal layer and the intermediate layer, so as to get an optical disc master plate.

21. The nano-fabrication method as claimed in claim 20, wherein the method of plating the metal layer on the surface of the intermediate layer comprises vacuum sputtering or electroplating.

22. The nano-fabrication method as claimed in claim 20, wherein the material of the metal layer is selected from metals comprising Ni, Ag, Pt, Pd, or an alloy thereof.

23. The nano-fabrication method as claimed in claim 5, wherein after forming the nano-pattern, the method further comprises:
  etching the substrate by using a dry etching process with the inorganic resist film as a mask; and
  removing the inorganic resist film, so as to transfer the nano-pattern to the surface of the substrate.

24. The nano-fabrication method as claimed in claim 23, wherein the dry etching process comprises RIE or ICP etching.

25. The nano-fabrication method as claimed in claim 23, wherein after transferring the nano-pattern to the surface of the substrate, the method further comprises:
  plating a metal layer on the surface of the substrate; and
  separating the metal layer and the substrate, so as to get an optical disc master plate.

26. The nano-fabrication method as claimed in claim 25, wherein the method of plating the metal layer on the surface of the substrate comprises vacuum sputtering or electroplating.

27. The nano-fabrication method as claimed in claim 25, wherein the material of the metal layer is selected from metals comprising Ni, Ag, Pt, Pd, or an alloy thereof.

28. The nano-fabrication method as claimed in claim 5, wherein the phase-change material is an alloy of elements selected from Se, Te, Sb, As, Sn, Ge, or In.

29. The nano-fabrication method as claimed in claim 28, wherein the phase-change material comprises Ge—Sb—Te, Ge—Sb—Sn, or In—Ge—Sb—Te alloy.

30. The nano-fabrication method as claimed in claim 29, wherein the phase-change material is Ge—Sb—Sn alloy.

* * * * *

UNITED STATES PATENT AND TRADEMARK OFFICE
CERTIFICATE OF CORRECTION

| | | |
|---|---|---|
| PATENT NO. | : 7,465,530 B1 | Page 1 of 1 |
| APPLICATION NO. | : 12/006708 | |
| DATED | : December 16, 2008 | |
| INVENTOR(S) | : Jung-Po Chen et al. | |

It is certified that error appears in the above-identified patent and that said Letters Patent is hereby corrected as shown below:

On the Title page of the patent grant, please replace item (75) inventors of the 6th inventor from Sheng-Li Chang, Jhubei(JP) to -- Sheng-Li Chang, Jhubei (TW) --

Signed and Sealed this

Thirty-first Day of August, 2010

David J. Kappos
*Director of the United States Patent and Trademark Office*